(12) United States Patent
Nagase et al.

(10) Patent No.: US 8,365,105 B2
(45) Date of Patent: Jan. 29, 2013

(54) METHOD OF PERFORMING OPTICAL PROXIMITY EFFECT CORRECTIONS TO PHOTOMASK PATTERN

(75) Inventors: Norimasa Nagase, Yokohama (JP); Koichi Suzuki, Yokohama (JP); Masahiko Minemura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 177 days.

(21) Appl. No.: 12/698,498

(22) Filed: Feb. 2, 2010

(65) Prior Publication Data

US 2010/0138019 A1 Jun. 3, 2010

Related U.S. Application Data

(63) Continuation of application No. PCT/JP2007/066010, filed on Aug. 17, 2007.

(51) Int. Cl.
*G06F 17/50* (2006.01)
(52) U.S. Cl. ............... 716/53; 716/54; 716/55
(58) Field of Classification Search ........... 716/53, 716/54, 55, 112, 119
See application file for complete search history.

(56) References Cited

U.S. PATENT DOCUMENTS

| 6,174,633 | B1 | 1/2001 | Tounai |
| 6,570,174 | B1 | 5/2003 | Tounai et al. |
| 6,724,092 | B2 | 4/2004 | Higuchi |
| 6,826,742 | B2 * | 11/2004 | Maeno et al. ............ 716/130 |
| 7,188,322 | B2 * | 3/2007 | Cohn et al. ............... 716/53 |
| 7,444,614 | B2 * | 10/2008 | Maeno et al. ............ 716/50 |
| 2002/0043615 | A1 | 4/2002 | Tounai et al. |
| 2002/0047089 | A1 | 4/2002 | Tounai et al. |
| 2002/0123866 | A1 * | 9/2002 | Lin ............................. 703/2 |
| 2002/0158214 | A1 * | 10/2002 | Lin et al. .................. 250/548 |
| 2006/0195809 | A1 * | 8/2006 | Cohn et al. ............... 716/10 |

FOREIGN PATENT DOCUMENTS

| JP | 2000-100692 A | | 4/2000 |
| JP | 2000-127744 | * | 5/2000 |
| JP | 2000-147744 A | | 5/2000 |
| JP | 2000-181046 A | | 6/2000 |
| JP | 2000-258893 A | | 9/2000 |
| JP | 2001-230250 A | | 8/2001 |
| JP | 2001-257263 A | | 9/2001 |
| JP | 2002-258459 A | | 9/2002 |

OTHER PUBLICATIONS

International Search Report of PCT/JP2007/066010, mailing date of Oct. 16, 2007.

* cited by examiner

*Primary Examiner* — Thuan Do
*Assistant Examiner* — Mohammed Alam
(74) *Attorney, Agent, or Firm* — Westerman, Hattori, Daniels & Adrian, LLP

(57) ABSTRACT

A method of performing an optical proximity effect correction to a first photomask pattern for a wiring of a semiconductor device for use in combination with a second photomask pattern for a via, the wiring including an end portion coupled to the via, the method being performed by a computer including a memory storing layout data of the first photomask pattern and the second photomask pattern, including extracting a pattern of layout data of the first photomask pattern for the wiring corresponding to the end portion of the wiring and layout data of the second photomask pattern for the via.

10 Claims, 13 Drawing Sheets

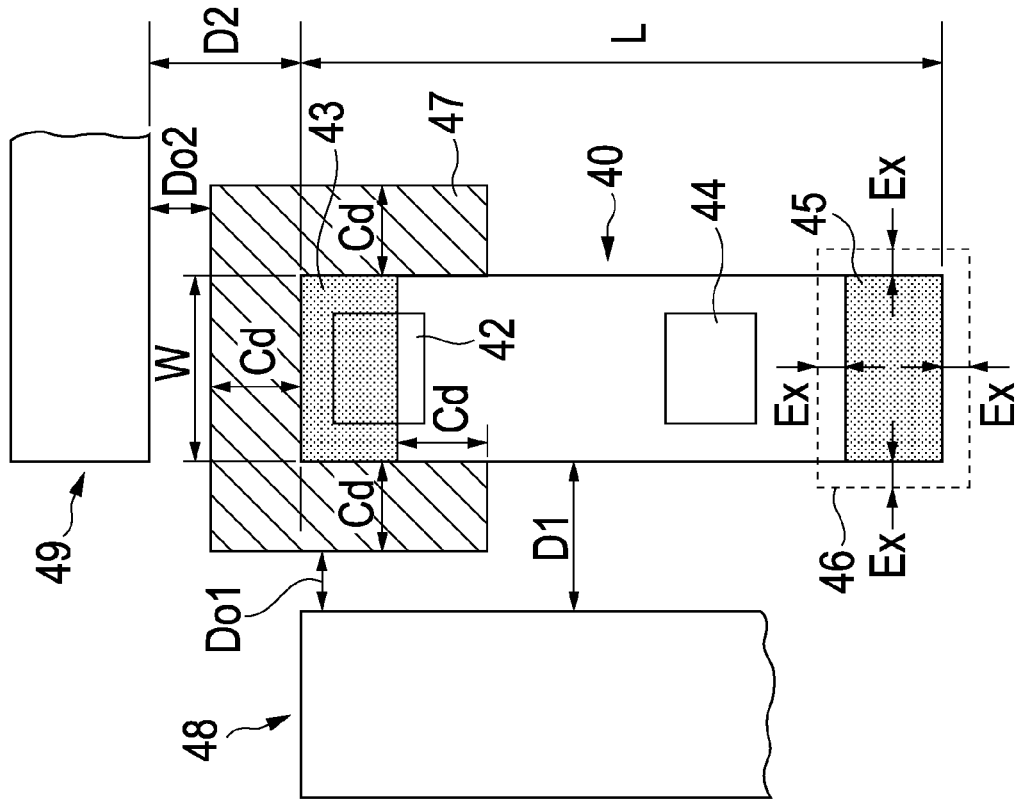
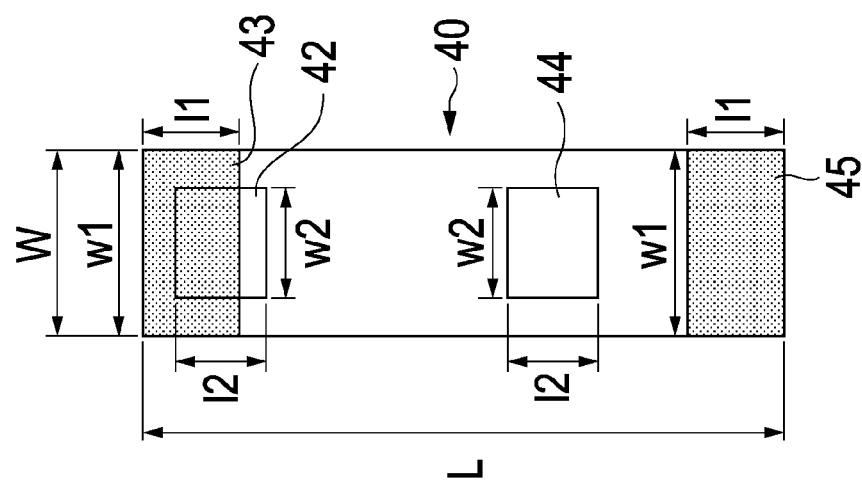

FIG. 8

| WIDTH W OF MASK WIRING PATTERN \ DISTANCE D TO ADJACENT MASK PATTERN | 120 | 130 | 140 | (UNIT: nm) |
|---|---|---|---|---|
| W<100 | NO OPC IS PERFORMED (NO END MARK IS GENERATED) | | | |
| 100 | 20 | 25 | 30 | |
| 120 | 20 | 25 | 30 | |
| 140 | 15 | 20 | 30 | |
| 160 | 15 | 20 | 30 | |
| 180 | 15 | 20 | 30 | |
| 200 | 15 | 20 | 30 | |
| 200<W | NO OPC IS PERFORMED (NO END MARK IS GENERATED) | | | |

METHOD OF PERFORMING OPTICAL PROXIMITY EFFECT CORRECTIONS TO PHOTOMASK PATTERN

CROSS-REFERENCE TO RELATED APPLICATION

This is a continuation of International Application No. PCT/JP2007/066010 filed on Aug. 17, 2007, the entire contents of which are incorporated herein by reference.

FIELD

An aspect of the embodiments discussed herein is directed to a method of performing optical proximity effect corrections to a photomask pattern.

BACKGROUND

One traditional approach to precisely forming a pattern on a substrate using an exposure apparatus is to perform optical proximity effect correction (hereinafter referred to as OPC) on a pattern on a photomask for use in exposure.

An optical proximity effect is a phenomenon in which the shape of a pattern formed on a substrate, such as a silicon wafer, (hereinafter referred to as "actual pattern") is different from the pattern on a photomask by diffraction or interference of light. OPC is correction of a pattern on a photomask to compensate for distortion occurring in the shape of the pattern caused by such an optical proximity effect. In general, a pattern on a photomask is corrected such that an actual pattern formed on a substrate resembles the original uncorrected pattern on the photomask, for example.

One known example of such an OPC technique is discussed in Japanese Laid-Open Patent Publication No. 2000-258893. This patent document discusses OPC performed when a contact for use coupled with other wiring is present in a termination or corner of wiring.

SUMMARY

According to an aspect of an embodiment, a method of performing a method of performing an optical proximity effect correction to a first photomask pattern for a wiring of a semiconductor device for use in combination with a second photomask pattern for a via, the wiring including an end portion coupled to the via, the method being performed by a computer including a memory storing layout data of the first photomask pattern and the second photomask pattern, including extracting a pattern of layout data of the first photomask pattern for the wiring corresponding to the end portion of the wiring and layout data of the second photomask pattern for the via, analyzing the extracted pattern of the layout data of the first photomask pattern for the wiring in comparison with portion of the second photomask pattern for the via so as to distinguish a sub-portion of extracted portion of the layout data of the first photomask pattern for the wiring corresponding to a part of the end portion of the wiring to which the via is to be coupled from the rest of the extracted portion corresponding to the rest of the end portion to which no via is to be coupled, and selectively applying an optical proximity effect correction to the sub-portion of the extracted portion of the layout data of the first photomask pattern for the wiring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B illustrate an example in which an end mark is generated in a wiring pattern and OPC is performed;

FIG. 8 is a table that illustrates the relationship between the distance D to an adjacent pattern and the OPC value Cd;

DESCRIPTION OF EMBODIMENTS

Figure 12:
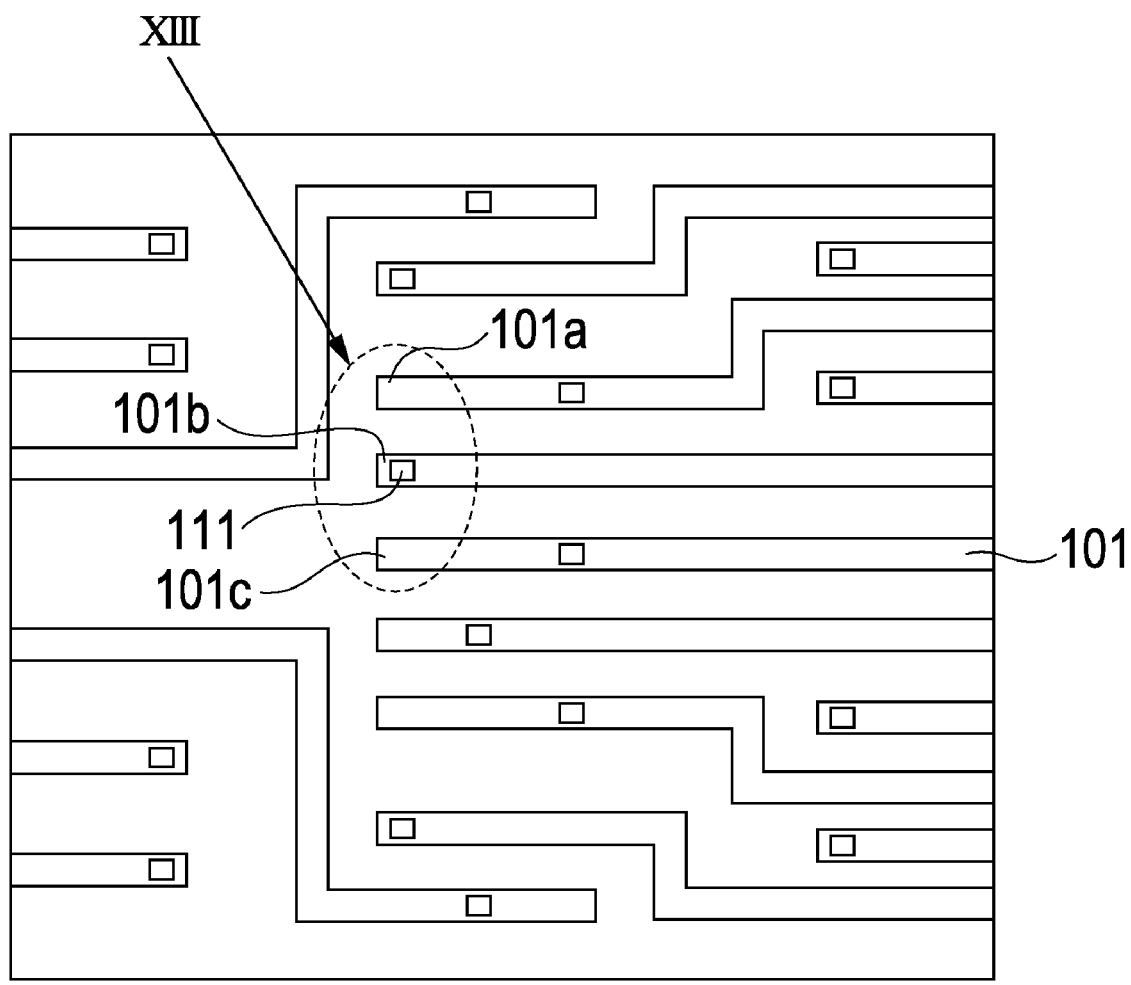
FIG. 12 illustrates example patterns formed on a photomask according to a traditional example.
Figure 13:
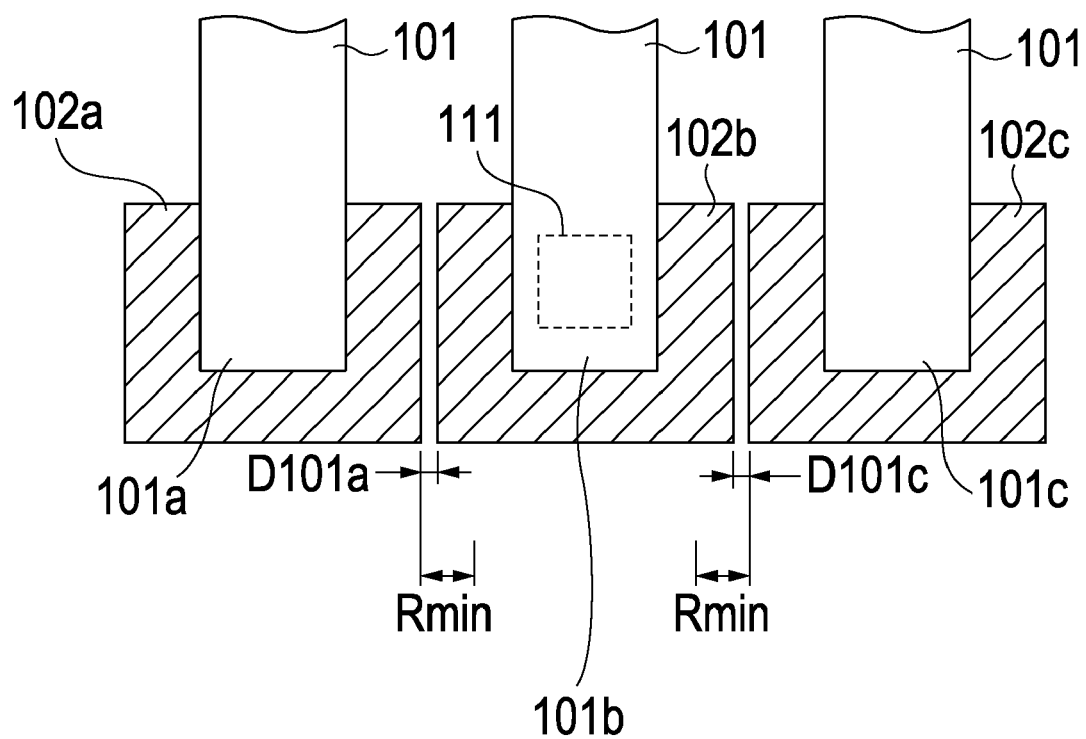
FIG. 13 is a magnified view of a region XIII illustrated in FIG. 12.

As described previously, in recent years, with a finer design of an integrated circuit pattern in a semiconductor device, there have been cases where some of the patterns on a photomask may not be subjected to OPC. One such example case is illustrated in FIGS. 12 and 13. FIG. 12 illustrates example patterns (a wiring pattern 101 and a via pattern 111) formed on a photomask. Here, a via formed on a substrate of a semiconductor chip by exposure using the via pattern 111 is coupled to wiring formed by exposure on the substrate. This wiring on the substrate is formed by the exposure using the wiring pattern 101. It is to be noted that for the sake of convenience of description the wiring pattern 101 and the via pattern 111 are illustrated in the same drawing of each of FIGS. 12 and 13, but in reality the wiring pattern 101 and the via pattern 111 are formed on different photomasks in ordinary cases.

FIG. 13 is a magnified view of the wiring pattern 101 in a region XIII in FIG. 12. The patterns illustrated in FIG. 12 are the ones before OPC, whereas the patterns illustrated in FIG. 13 are the ones after OPC. Regions 102a, 102b, and 102c, which are hatched in the drawing, are regions where the shape of the pattern is enlarged by OPC.

As illustrated in FIG. 13, ends 101a, 101b, and 101c of the wiring pattern 101 of the photomask may not be subjected to sufficient OPC. Specifically, if all the ends are subjected to OPC, a problem arises in that the gaps D101a and D101c of the pattern after OPC are less than the minimum value Rmin of the gap of the wiring pattern defined by, for example, a wiring rule.

Embodiments of the present technique are described in detail below with reference to the drawings. The embodiments are illustrative, and the present technique is not limited to configurations illustrated in the embodiments.

Figure 1:
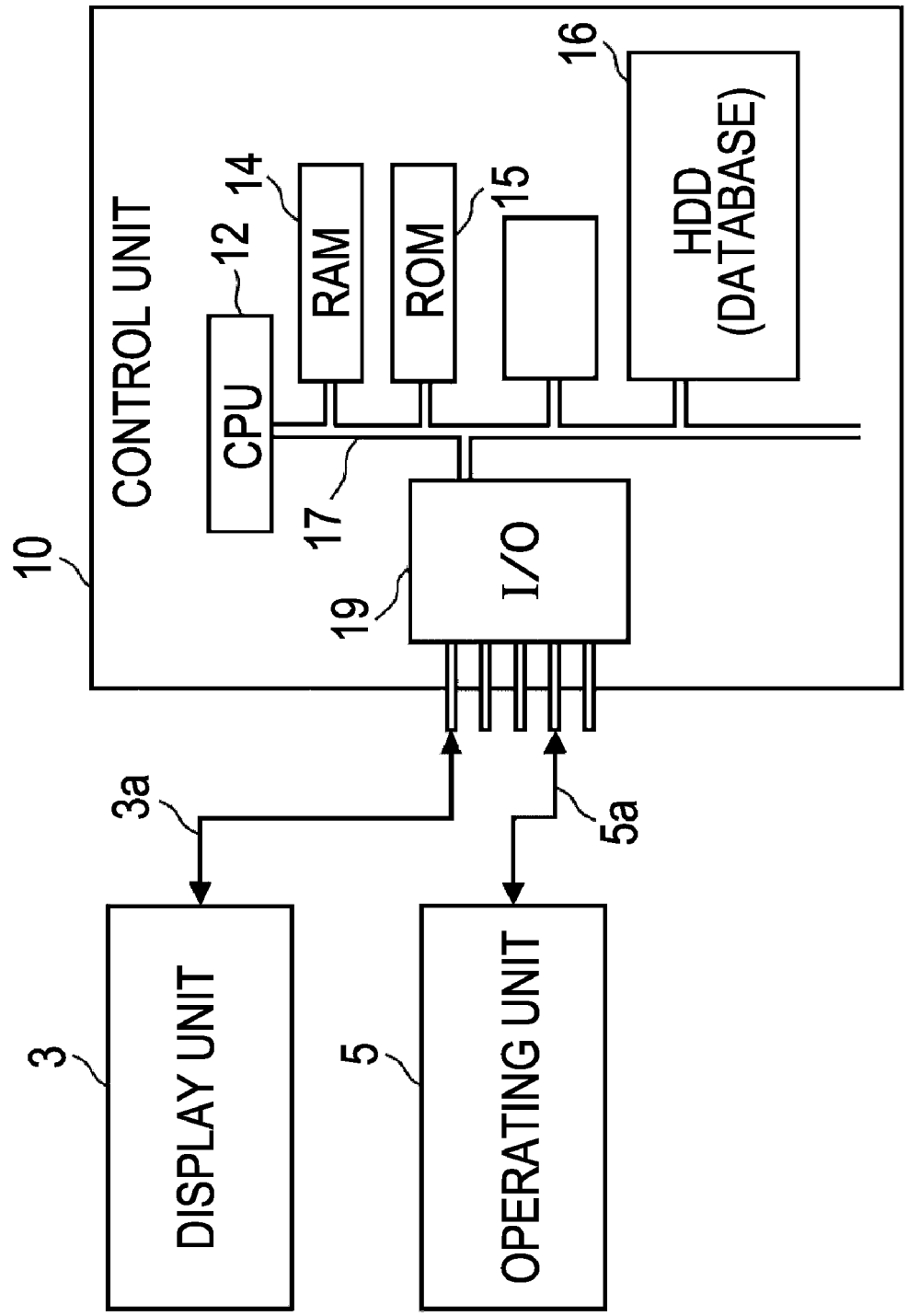
FIG. 1 is a block diagram that illustrates a schematic configuration of a photomask design apparatus.

A photomask design apparatus 1 for use in designing a pattern on a photomask according to the present embodiment is described below using FIG. 1. FIG. 1 is a block diagram that illustrates a schematic configuration of the photomask design apparatus 1. As illustrated in FIG. 1, the photomask design apparatus 1 may include a control unit 10 configured to control the whole apparatus, a display unit 3, and an operating unit 5, for example. The display unit 3 and the operating unit 5 are coupled to the control unit 10 through control wiring 3a and control wiring 5a, respectively. The display unit 3 may be a display device, such as a display. The operating unit 5 may be an input device, such as a keyboard or a mouse.

The control unit 10 may include a central processing unit (CPU) 12, a random-access memory (RAM) 14 for temporarily storing data, such as one processed by the CPU 12, a read-only memory (ROM) 15 in which a control program or other data may be stored, an input/output circuit (I/O) 19 for receiving a signal from the outside and outputting a signal to the outside, and a bus 17 allowing a signal to be transmitted among the above elements, for example. The control unit 10 may further include a magnetic disk unit (hard disk drive (HDD)) 16 in which a database containing design data necessary to form a photomask may be stored.

Figure 2:
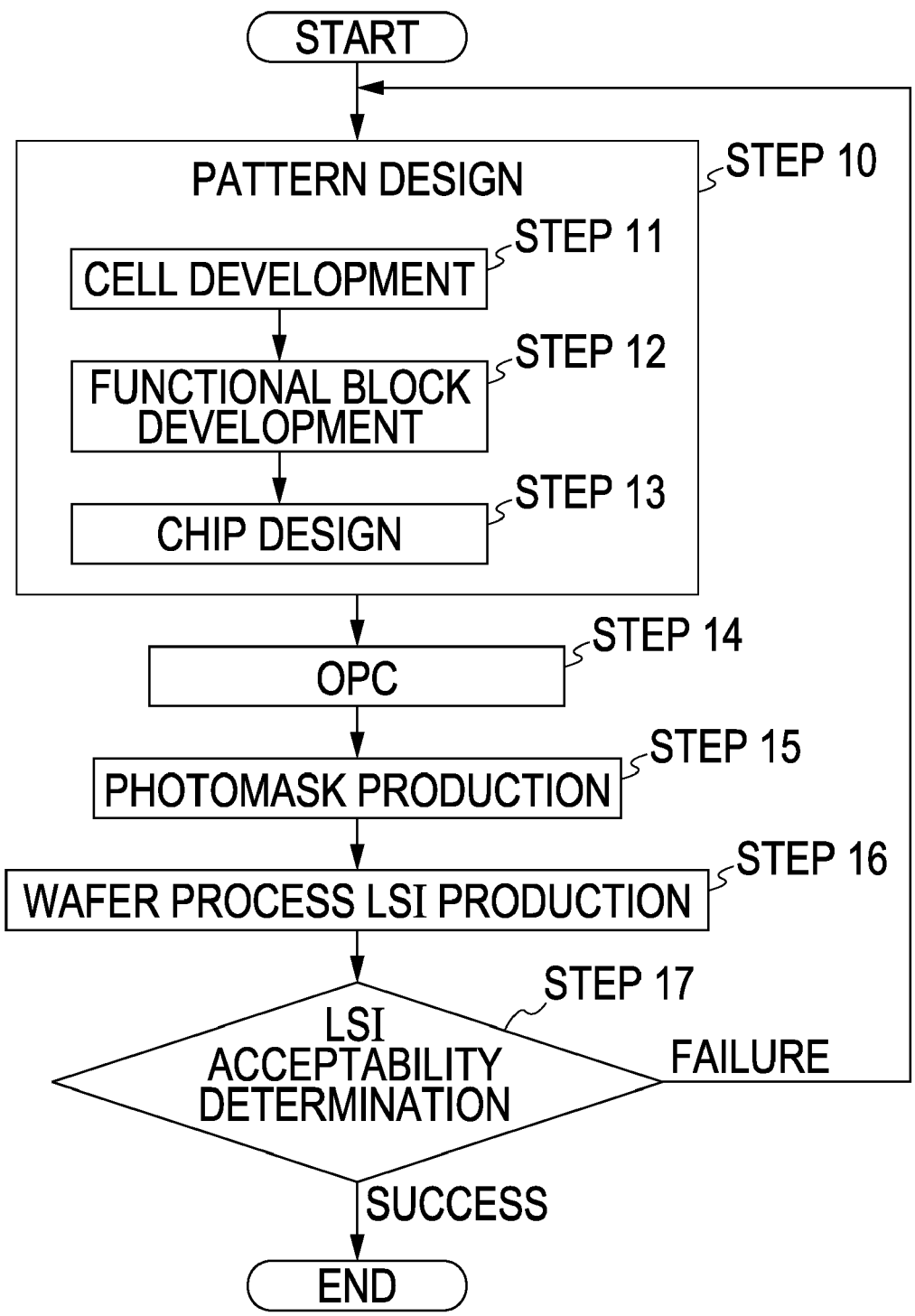
FIG. 2 is a flowchart that illustrates steps of fabricating a semiconductor device.

Next, steps for fabricating a semiconductor device according to the present embodiment are described. FIG. 2 is a flowchart that illustrates steps for fabricating the semiconductor device using a photomask according to the present embodiment. A semiconductor device may be a large-scale integrated circuit (LSI), for example. Examples of the form of the semiconductor device include a semiconductor chip that is a piece formed by cutting of a silicon wafer and an electronic component on which such a semiconductor chip is mounted. In the following description, for the sake of convenience, a method of fabricating an LSI having the form of an electronic component on which a semiconductor device is mounted is described.

Steps for fabricating an LSI are described below. As illustrated in FIG. 2, first, an overall semiconductor chip pattern is designed (Step 10). Next, OPC is performed on the designed pattern (Step 14), and then, a photomask is produced using the pattern subjected to OPC (Step 15).

The photomask may be produced by the formation of a pattern as a light-shielding film on a substrate having optical transparency (not illustrated), for example. The substrate is made of a transparent material, such as quartz. The pattern as the light-shielding film may be a wiring pattern, a via pattern, or other patterns, and is made of a metallic material, such as chrome. In the following description, for the sake of convenience, a substrate used in a photomask is called "mask substrate," and a pattern formed on the mask substrate is called "mask pattern." In addition, a mask pattern for use in forming wiring by exposure is called "mask wiring pattern," and a mask pattern for use in forming a via by exposure is called "mask via pattern." The OPC to a photomask pattern for wirings of a semiconductor device is performed by using in combination with an associated (second) photomask pattern for vias, the wiring including a plurality of end portions a part of which are to be coupled to the vias, respectively, the method being performed by a computer including a memory storing layout data of the photomask patterns.

Next, a wafer made of, for example, silicon, is exposed with a pattern using the photomask to form wiring and the like on the wafer. Then, the wafer is separated into pieces by, for example, dicing to produce an LSI (Step 16).

As illustrated in FIG. 2, after an LSI is produced, it is determined whether the LSI functions properly (Step 17). If it does not function properly (Failure in Step 17), flow returns to the initial pattern design step (Step 10), where the pattern is redesigned.

As illustrated in FIG. 2, in Step 10 of pattern design, a cell development step (Step 11), a functional block forming step (Step 12), and a chip design step (Step 13) are sequentially carried out. The cell development step (Step 11) is the step of developing a cell to be used as a circuit formed on a wafer. Here, design data on a pattern corresponding to the circuit of the cell is developed. The functional block forming step (Step 12) is the step of designing a functional block composed of one or more cells using design data on the cell or cells developed in the cell development step. The design data developed in this step may be data on information about couple of wiring of a circuit, for example. The chip design step (Step 13) is the step of designing an overall semiconductor chip pattern by associating the design data on the functional block developed in the functional block forming step with the pattern design data on each cell.

Figure 3:
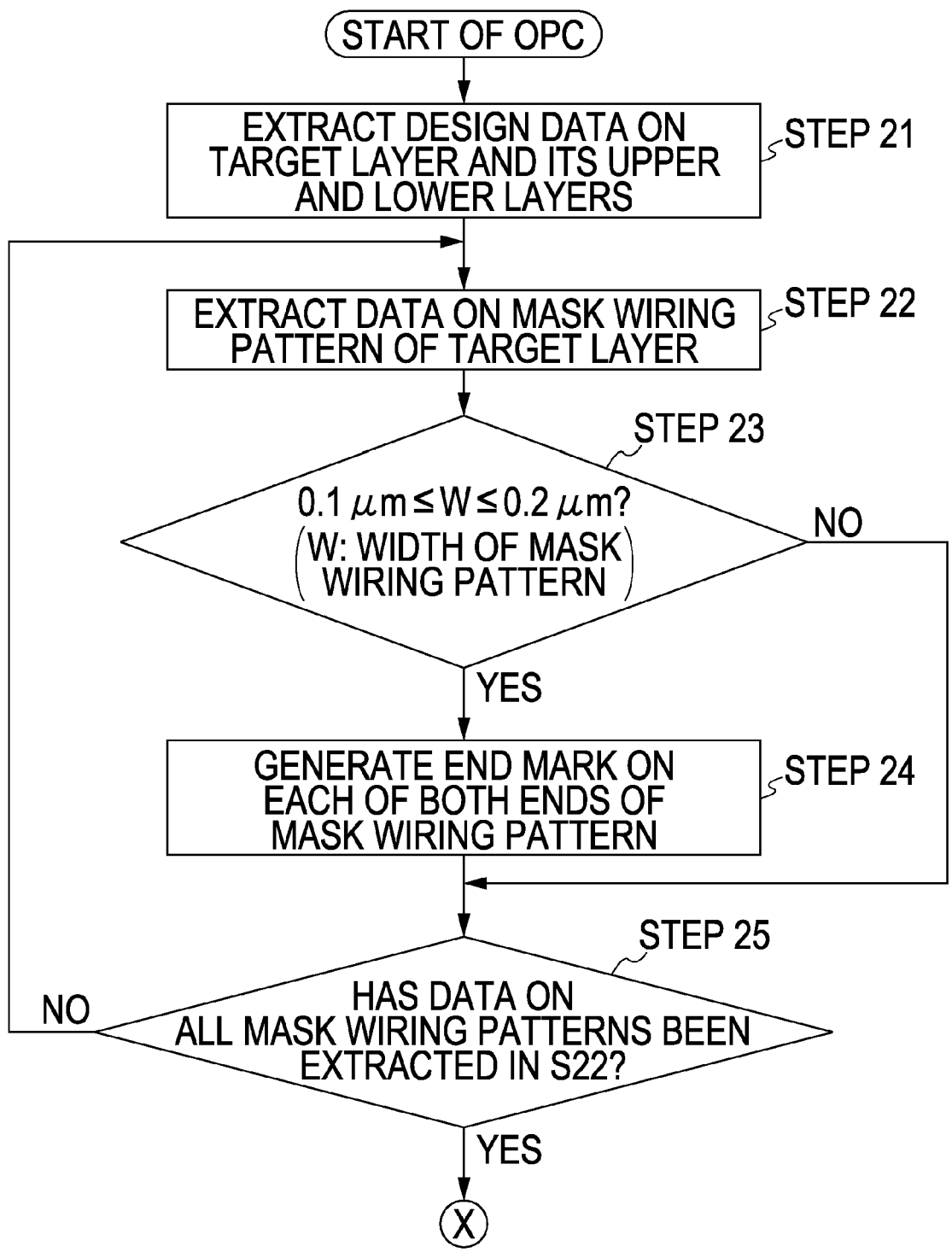
FIG. 3 is a flowchart (part I) that illustrates a specific procedure for OPC.
Figure 4:
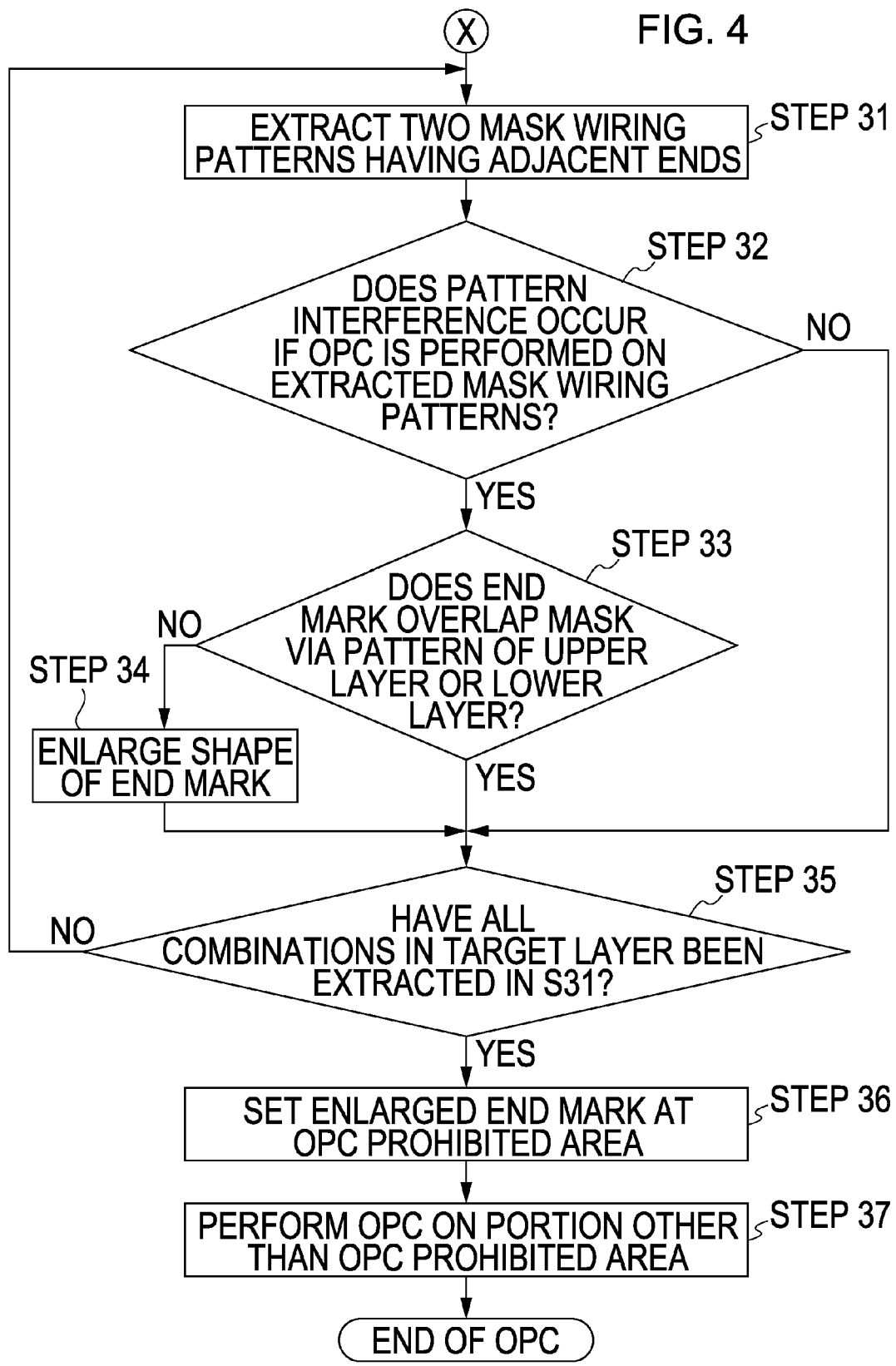
FIG. 4 is a flowchart (part II) that illustrates the specific procedure for OPC.
Figure 5:
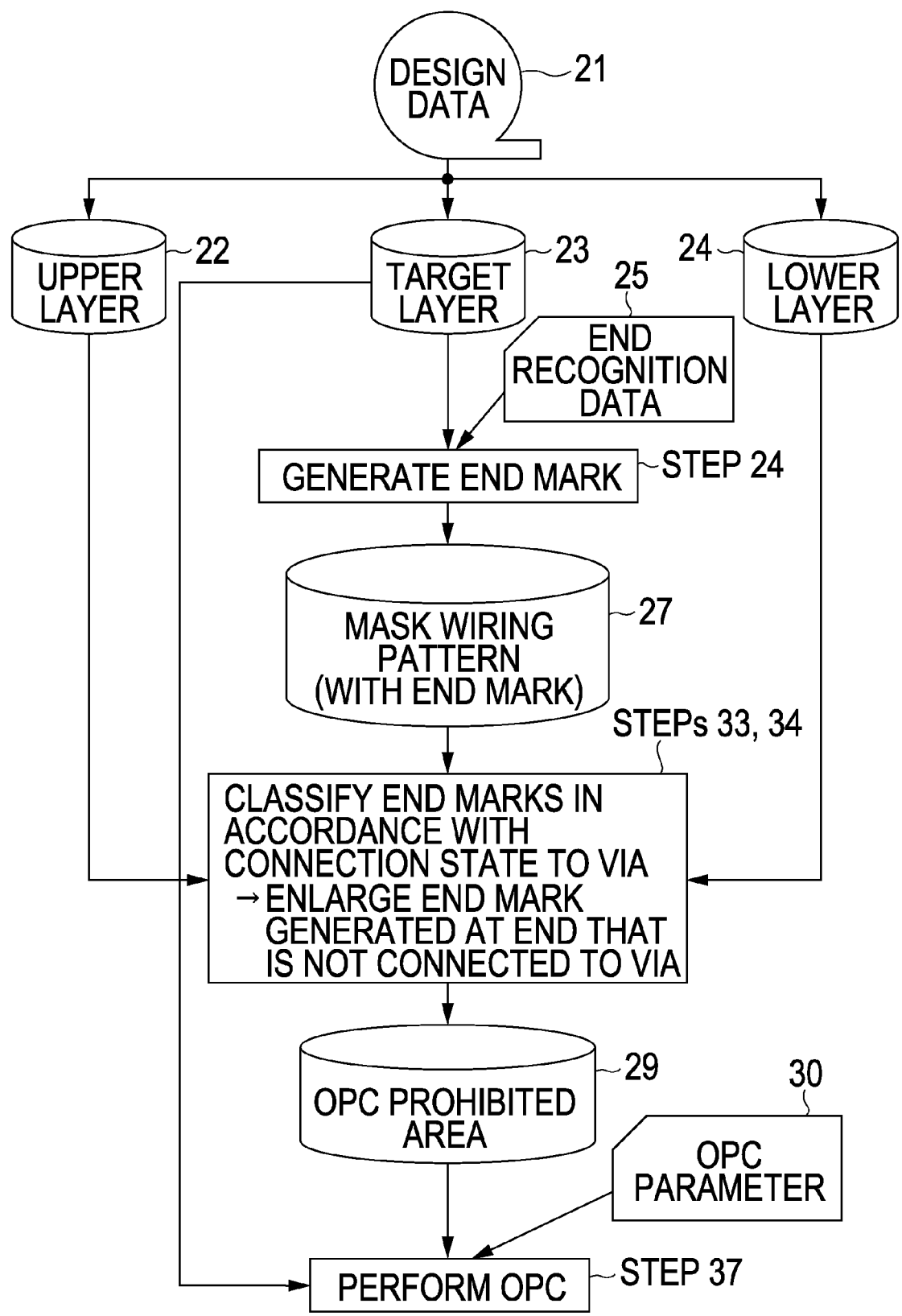
FIG. 5 illustrates a data flow in a control unit.

The details of OPC in Step 14 are described below. FIGS. 3 and 4 are flowcharts that illustrate a specific procedure of the OPC. FIG. 5 illustrates a data flow in the control unit 10 in accordance with the flowcharts illustrated in FIGS. 3 and 4.

The procedure for performing OPC is described below. As illustrated in FIG. 3, first, data on a target layer and its upper and lower layers is extracted (Step 21). Specifically, as illustrated in FIG. 5, design data 23 on the target layer, design data 24 on the upper layer adjacent to the target layer, and design data 25 on the lower layer adjacent to the target layer are extracted from design data 21. The extracted design data 22, 23, and 24 may be stored in a storage area, such as the HDD 16, for example. Here, the target layer indicates a wiring layer selected as being a target for OPC from among wiring layers to be formed on a wafer. Here, the upper and lower layers adjacent to the target layer are wiring layers existing vertically adjacent to the target layer. No wiring layer is present between the target layer and each of its adjacent upper and lower layers. Alternatively, only either one of the design data on the upper layer and that on the lower layer may be extracted.

Next, design data on a mask wiring pattern of the target layer is extracted (Step 22). The pattern of layout data of the photomask pattern for wirings corresponding to the end portions of the wirings and layout data of the associated photomask patterns for vias is extracted. Specifically, design data on a section corresponding to the mask wiring pattern is extracted from the design data 23 on the target layer extracted in Step 21 by, for example, processing carried out by the control unit 10. The extracted design data on the mask wiring pattern may be stored in the storage area (e.g., HDD 16).

Next, it is determined whether the width of the mask wiring pattern indicated by the design data extracted in Step 22 is in the range from 0.1 μm to 0.2 μm, for example. The extracted pattern of the layout data of the associated photomask pattern for wirings in comparison with portion of the photomask pattern for vias is analyzed so as to distinguish a sub-portion of extracted portion of the layout data of the photomask pattern for wirings corresponding to a part of the end portions of the wirings to which the vias are to be coupled respectively from the rest of the extracted portion corresponding to the rest of the end portions to which no via is to be coupled. If the width of the mask wiring pattern is in the range from 0.1 μm to 0.2 μm (Yes in Step 23), flow proceeds to Step 24. If the width of the mask wiring pattern is not in the range from 0.1 μm to 0.2 μm (No in Step 23), that is, if the width of the mask wiring pattern is smaller than 0.1 μm or larger than 0.2 μm, flow proceeds to Step 25. Specifically, design data on a mask wiring pattern within the range from 0.1 μm to 0.2 μm is extracted from design data on mask wiring patterns stored in the storage area (e.g., HDD 16) in Step 22 by, for example, processing carried out by the control unit 10. The extracted design data on the mask wiring pattern may be stored in the storage area (e.g., HDD 16). This step is not essential, so flow may proceed from Step 22 directly to Step 24.

Next, an end mark is generated on each of both ends of the mask wiring pattern (Step 24). Specifically, the design data on the mask wiring pattern stored in Step 23 is extracted from the storage area (e.g., HDD 16) by, for example, processing carried out by the control unit 10. An end mark is generated on each of both ends of the mask wiring pattern indicated by the extracted design data. Design data 27 (FIG. 5) on the mask wiring pattern to which the end marks are added may be stored in the storage area (e.g., HDD 16). If flow proceeds from Step 22 directly to Step 24, end marks are generated on all the ends indicated by the design data extracted in Step 22.

In the present embodiment, the minimum value of the width of the mask wiring pattern is set at 0.1 μm. For example, in the case of a sharp-edged pattern having no function as wiring, it is not necessary to be recognized as a mask wiring pattern 40 (FIG. 6A). Therefore, the lower limit to the width of the pattern is set such that end marks 43 and 45 are not generated on an end of a sharp-edged pattern. An increase in the width of wiring strengthens a tendency to resist the optical proximity effect. The present embodiment is set such that, if the width of the mask wiring pattern 40 is larger than 0.2 μm, OPC for an end of the mask wiring pattern is not performed. Accordingly, it is set such that, if the width of the mask wiring pattern 40 is larger than 0.2 μm, neither of the end marks 43 and 45 is generated.

From the above reasons, in the present embodiment, a mask wiring pattern in which an end mark is to be generated is limited to one that has its wiring width being within the range, for example, from 0.1 μm to 0.2 μm. Such a condition for generating such an end mark may be input into the control unit 10 from the outside, as illustrated in FIG. 5 (end recognition parameter 25). Alternatively, the condition may be stored in advance in the HDD 16 so as to allow the control unit 10 to recognize an end on the basis of the condition. One example of the end recognition parameter 25 illustrated in FIG. 5 is illustrated in FIG. 8. FIG. 8 illustrates the amount of OPC associated with the wiring width. As illustrated in the table of FIG. 8, for example, if the width of the mask wiring pattern is smaller than 100 nm and if it is larger than 200 nm, OPC is not performed, so no end mark is generated.

One example of an end mark is illustrated in FIG. 6A. FIG. 6A illustrates an example in which end marks are generated on the mask wiring pattern 40. Patterns having the shape of w2×l2 illustrated in FIG. 6A are mask via patterns. A wiring layer in which vias (not illustrated) corresponding to these mask via patterns 42 and 44 are present is adjacent to a wiring layer in which wiring (not illustrated) corresponding to the mask wiring pattern 40 is present, in terms of actual patterns formed on a wafer. That is, on the wafer, the vias and the wring are in contact with each other. As illustrated in FIG. 6A, each of the end marks is a rectangular pattern having three sides overlapping edges of the mask wiring pattern (a pattern having the shape of w1×l1). In FIG. 6A, the width w1 of each of the end marks 43 and 45 is the same as the width W of the mask wiring pattern 40. However, the width w1 of each of the end marks 43 and 45 may be different from the width W of the mask wiring pattern 40. Here, the length l1 of each of the end marks 43 and 45 illustrated in FIG. 6A may be 50 μm, for example. As described later, when OPC is performed such that the range of the pattern is enlarged by a fixed quantity from the periphery of the mask wiring pattern 40, if three side of each of the end marks 43 and 45 match with edges of the mask wiring pattern 40, processing may be more simplified. That is, if three sides of each of the end marks 43 and 45 match with edges of the mask wiring pattern 40, all of the outer edges of the end marks 43 and 45 are enlarged by a fixed quantity, as described above, a region that contains any one of the region of the end mark 43, the region of the end mark 45, and the region of the mask wiring pattern 40 after enlargement (OR region) is simply set at the periphery of the mask wiring pattern 40.

Next, it is determined whether design data on all the mask wiring patterns 40 of the target layer has been extracted in Step 22. If the extraction of design data on all the mask wiring patterns 40 of the target layer in Step 22 has not yet been completed (No in Step 25), flow returns to Step 22, and design data on a remaining mask wiring pattern 40 of the target layer is extracted. If the extraction of design data on all the mask wiring patterns 40 has been completed (Yes in Step 25), flow proceeds to Step 31 illustrated in FIG. 4. Specifically, the design data 23 on the target layer is compared with the history of extraction of design data on mask wiring patterns in Step 22 by, for example, processing carried out by the control unit 10. If the comparison illustrates that a mask wiring pattern that has not yet been extracted in Step 22 remains in the design data 23, flow returns to Step 22. If there is no mask wiring pattern that has not yet been extracted in the design data 23, flow proceeds to Step 31. It is to be noted that after Step 25 is completed flow may proceed directly to Step 34. That is, Steps 31 to 33 are not essential. In the case where flow proceeds directly to Step 34, the shape of an end mark of the mask wiring pattern is enlarged in Step 34, and then flow proceeds to Step 35.

Next, two mask wiring patterns 40 having adjacent ends are extracted from among the mask wiring patterns 40 having the end marks 43 and 45 (Step 31). Specifically, design data on two mask wiring patterns having adjacent ends is extracted from the above-described design data 27 by, for example, processing carried out by the control unit 10. The extracted design data on the mask wiring patterns may be stored in the storage area (e.g., HDD 16).

Figure 7:
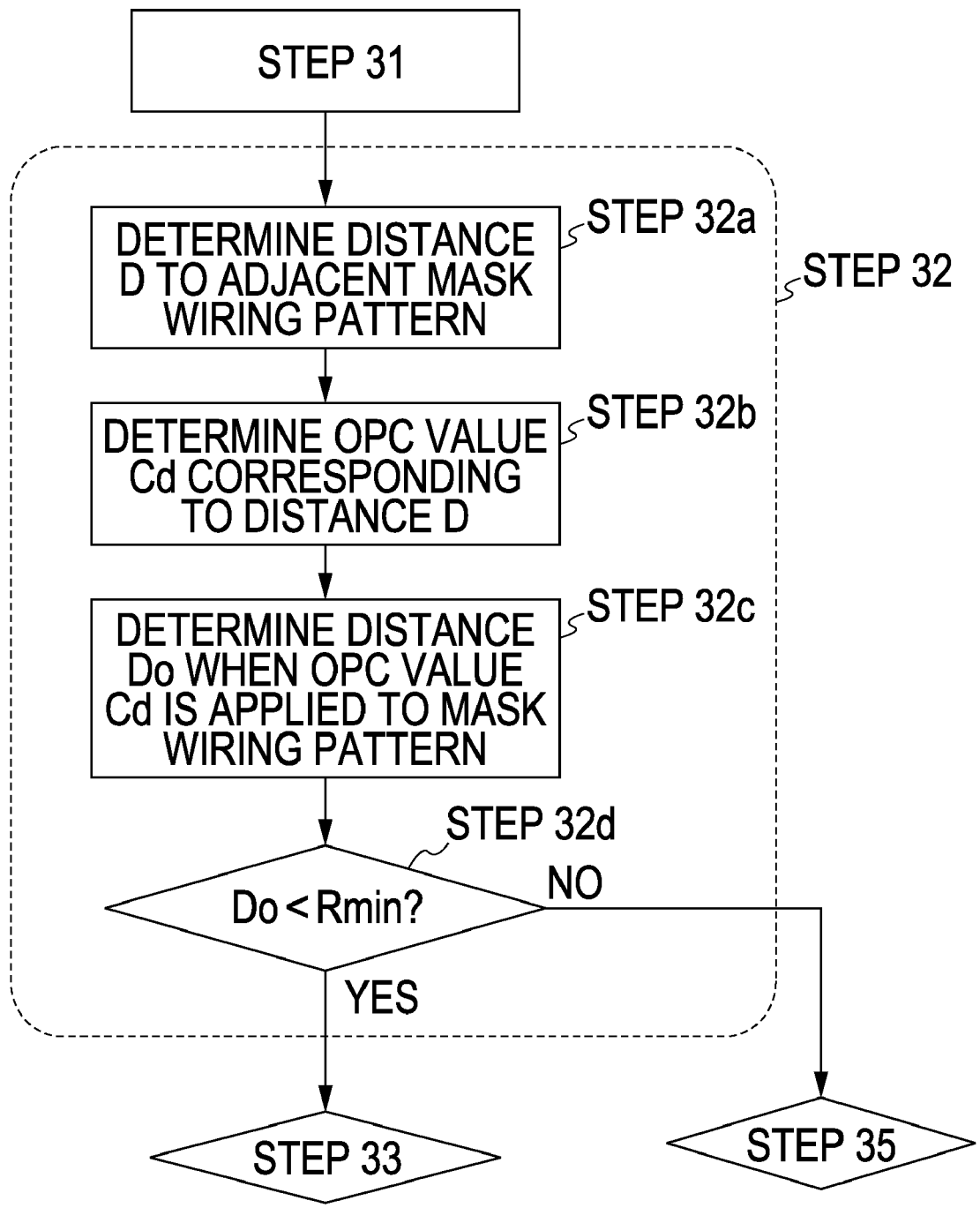
FIG. 7 is a flowchart that illustrates a specific example of a process for determining whether pattern interference occurs.

Next, it is determined whether pattern interference occurs if OPC is performed on the mask wiring patterns indicated by the extracted design data. Here, the pattern interference indicates a state in which the distance between mask wiring patterns is smaller than a set value defined by a predetermined wiring rule. If such pattern interference occurs (Yes in Step 32), flow proceeds to Step 33; if no such pattern interference occurs (No in Step 32), flow proceeds to Step 35. The processing of Step 32 may be carried out in accordance with the flowchart illustrated in FIG. 7, for example. FIG. 7 is a flowchart that illustrates a specific example of the processing of Step 32.

As illustrated in FIG. 7, first, the distance D to the adjacent mask wiring pattern is determined (Step 32a). Specifically, the distance D is determined on the basis of the design data on the two mask wiring patterns extracted in Step 31 by, for example, processing carried out by the control unit 10. This is described below using an example illustrated in FIG. 6B. FIG. 6B illustrates an example in which OPC is performed when mask wiring patterns (40, 48, 49) are arranged adjacent to each other. As illustrated in FIG. 6B, when the mask wiring patterns 40 and 48 are extracted, the distance between these mask wiring patterns is D1. When the mask wiring patterns 40 and 49 are extracted, the distance between these mask wiring patterns is D2. That is, for the mask wiring pattern 40, the distance to the adjacent mask wiring pattern 48 is D1, and the distance to the adjacent mask wiring pattern 49 is D2.

Next, an OPC value Cd corresponding to the distance D determined in Step 32*a* is determined (Step 32*b*). The OPC value Cd may be determined on the basis of a table illustrated in FIG. 8, for example. This table is design data contained in the end recognition parameter 25 illustrated in FIG. 5 and illustrates the relationship between the distance D to an adjacent pattern (distance before OPC) and the OPC value Cd. This table also illustrates the relationship between the wiring width W and the OPC value Cd. Specifically, by, for example, processing carried out by the control unit 10, the data in the table illustrated in FIG. 8 is referred to from the storage area (e.g., HDD 16) and the OPC value Cd corresponding to the distance D determined in Step 32*a* is determined. In the case where a plurality of adjacent patterns exist, as described above, the OPC value Cd may be determined using the distance D being the minimum value, for example.

Next, the distance Do when the OPC value Cd is applied to the mask wiring pattern is determined (Step 32*c*). Specifically, by, for example, processing carried out by the control unit 10, the shape of an end of the mask wiring pattern is enlarged by applying the OPC value Cd determined in Step 32*b* and using substantially the same method as that used when OPC is performed. One example method of enlarging the shape is to uniformly enlarge the periphery of the end mark 43 by the value of Cd, as illustrated in FIG. 6B, and set the enlarged area at a correction area 47. That is, the shape of the end of the mask wiring pattern 40 is enlarged to the shape of the correction area 47. In FIG. 6B, only an end mark at an end in which a mask via pattern is present (end mark 43) is enlarged. However, in this step, the shape of each of all the ends (end marks 43 and 45) may be enlarged. Next, for the mask wiring pattern after its end is enlarged, the distance Do to its adjacent mask wiring pattern is determined. For example, for the mask wiring pattern 40 illustrated in FIG. 6B, the distance to the mask wiring pattern 48 is Do1, and the distance to the mask wiring pattern 49 is Do2.

Next, the distance Do determined in Step 32*c* and the minimum value Rmin of the pattern gap defined by a wiring rule or the like are compared. If the value of Do is smaller than the value of Rmin (Yes in Step 32*d*), flow proceeds to Step 33; if the value of Do is equal to or larger than the value Rmin (No in Step 32*d*), flow proceeds to Step 35. One example of the value of Rmin may be 70 nm. Specifically, the minimum value Rmin of the pattern gap defined by a wiring rule or the like is extracted from the storage area (e.g., HDD 16) by, for example, processing carried out by the control unit 10. Then, the extracted minimum value is compared with the distance Do determined in Step 32*c*. If the distance Do is smaller than the minimum value Rmin, that is, if Do<Rmin, flow proceeds to Step 33; if the distance Do is equal to or larger than the minimum value Rmin, that is, if Do≧Rmin (No in step 32*d*), flow proceeds to Step 35.

Next, it is checked whether the end mark overlaps a mask via pattern of the upper layer or lower layer. If the end mark overlaps the mask via pattern of the upper layer or lower layer (Yes in Step 33), flow proceeds to Step 35; if the end mark does not overlap the mask via pattern (No in Step 33), flow proceeds to Step 34. It is to be noted that, even if the end mark does not overlap the mask via pattern of the upper layer or lower layer, when the gap between the end mark and the mask via pattern is within a predetermined distance range, it may be determined that they overlap each other. That is, in this step, as illustrated in FIG. 5, end marks are classified in accordance with the coupled state to a via. Specifically, it is checked by, for example, processing carried out by the control unit 10 whether there is a region where the end mark and the mask via pattern overlap each other. If there is a region where the end mark and the mask via pattern overlap each other, it is determined that the mask via pattern is present in the end of the mask wiring pattern (Yes in Step 33), so flow proceeds to Step 35. If no such an overlap region exists, it is determined that no mask via pattern is present in the end of the mask wiring pattern (No in Step 33), so flow proceeds to Step 34.

Here, the state in which a mask via pattern is present in an end of a mask via pattern indicates the state in which, when wiring is formed on a substrate, a via (not illustrated) existing in an upper layer or lower layer with respect to the wiring is coupled to an end of the wiring. Accordingly, for example, in the case illustrated in FIG. 6B, there is a region where the end mark 43 overlaps the mask via pattern 42, whereas there is no region where the end mark 45 overlaps any mask via pattern. That is, the end mark 43 is an end for use in exposing a substrate with a pattern coupled to a via formed on a substrate (coupled end), whereas the end mark 45 is an end for use in exposing a substrate with a pattern that is not coupled to a via formed on a substrate (non-coupled end). The pattern used here is a pattern of wiring formed on a substrate.

Next, the shape of the end mark is enlarged (Step 34). Specifically, by, for example, processing carried out by the control unit 10, design data on an end mark generated at an end that is not coupled to a via is extracted from the storage area (e.g., HDD 16), and the shape of that end mark is enlarged. The design data on the enlarged end mark may be stored in the storage area (e.g., HDD 16).

An example in which an end mark is enlarged is illustrated in FIG. 6B. A rectangular region indicated by the dotted lines illustrated in FIG. 6B is an end mark 46 after enlargement. In Step 34, as illustrated in FIG. 6B, for example, the periphery of the end mark 45 being a target may be uniformly enlarged by the extended amount Ex being 6 nm. Hereinafter, a process of uniformly enlarging the periphery of a region by a predetermined amount, as described above, may be referred to also as enlargement.

Next, it is determined whether all combinations in the target layer have been extracted in Step 31. If the extraction of all combinations in the target layer in Step 31 has not yet been completed (No in Step 35), flow returns to Step 31; if the extraction of all combinations in Step 31 is completed (Yes in Step 35), flow proceeds to the next Step 36. Specifically, design data on the mask wiring pattern extracted in Step 31 is checked by, for example, processing carried out by the control unit 10, and it is compared with the above-described design data 27 to determine whether a mask wiring pattern that has not yet been extracted in Step 31 remains in that design data 27. If a mask wiring pattern that has not yet been extracted in Step 31 remains in that design data 27 (No is Step 35), flow returns to Step 31. If no such a mask wiring pattern that has not yet been extracted remains in the design data 27 (Yes in Step 35), flow proceeds to Step 36.

Next, the region of the end mark 45 subjected to the enlargement in Step 34 is set at an OPC prohibited area (Step 36). Specifically, the area 46 formed by the enlargement of the end mark 45 is extracted from the storage area (e.g., HDD 16) by, for example, processing carried out by the control unit 10. Then, the extracted enlarged region 46 is set at an OPC prohibited area. Design data 29 on that OPC prohibited area may be stored in the storage area (e.g., HDD 16). The method of setting an OPC prohibited area described here is merely an example. An OPC prohibited area may also be set by some other method.

As described above, in the present embodiment, the area formed by the enlargement of the end mark 45 is set as an OPC prohibited area. It is to be noted that there are different types of OPC for a mask wiring pattern, in addition to the above-described OPC performed on an end mark. One example of OPC different from the OPC performed on an end mark may be OPC performed in a width direction of a pattern. Such OPC performed in a width direction of a pattern or some other OPC may slightly expand the width of a mask wiring pattern. These different types of OPC may be applied in various ways case by case. For example, OPC by which a mask wiring pattern is expanded in its width direction may be applied before OPC for an end is performed. In this case, after an OPC prohibited area is set, before OPC is performed on an end, the width of the mask wiring pattern may be expanded. Accordingly, if the amount of this increase in the width of the mask wiring pattern is not considered, the enlarged mask wiring pattern may be larger than the OPC prohibited area. To address this, it is preferable that the extended amount Ex of the end mark 45 in Step 34 be the largest among the extended amounts in all OPC processes for a mask wiring pattern other than OPC performed on an end. Setting such a value enables the end to be contained in the OPC prohibited area with reliability.

Lastly, OPC is performed on all regions other than the OPC prohibited area (Step 37). The optical proximity effect corrections to the sub-portion of the extracted portion of the layout data of the photomask data for wirings is selectively applied. Here, instead of performing OPC on all regions, a method described below may be used. That is, the design data 29 on the OPC prohibited area stored in the storage area (e.g., HDD 16) in Step 36 is extracted by, for example, processing carried out by the control unit 10, and end marks present in regions other than that OPC prohibited area are selected. Then, the shape of each of only the selected end marks is enlarged. Alternatively, a method of extracting an end of a mask wiring pattern, the end being coupled to a via formed on a substrate, and performing OPC on only the extracted end may also be used.

A method of enlarging an end mark is described below. First, the OPC value Cd is determined by substantially the same method as that used in Steps 32a and 32b described above. A condition for determining the OPC value Cd may be input into the control unit 10 from the outside, as illustrated in FIG. 5 (OPC parameter 30), for example. Alternatively, the condition may be stored in the HDD 16 in advance so as to allow the control unit 10 to identify the OPC value Cd on the basis of the condition. One example of the OPC parameter 30 illustrated in FIG. 5 is illustrated in FIG. 8. FIG. 8 illustrates the amount of OPC associated with the distance D to an adjacent pattern. As illustrated in the table of FIG. 8, for example, if the distance D to the adjacent pattern is 140 nm, OPC is performed so as to uniformly enlarge the periphery of the end mark 43 by 30 nm. Next, the shape of the end mark 43 is enlarged in accordance with the determined OPC value Cd. After that, the shape of the end of the mask wiring pattern 40 is enlarged to the correction area 47 of the enlarged end mark.

Figure 9:
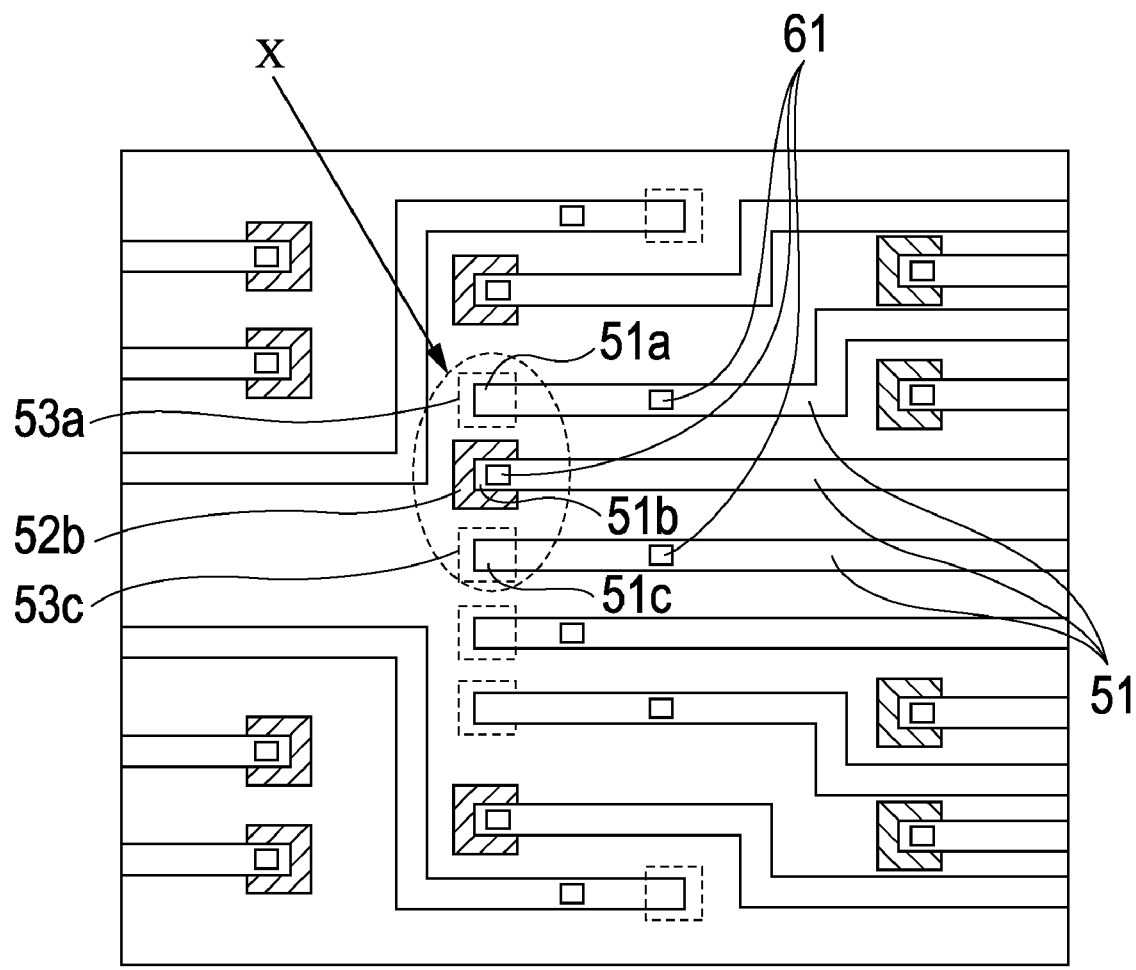
FIG. 9 illustrates an example of patterns formed on a photomask.
Figure 10:
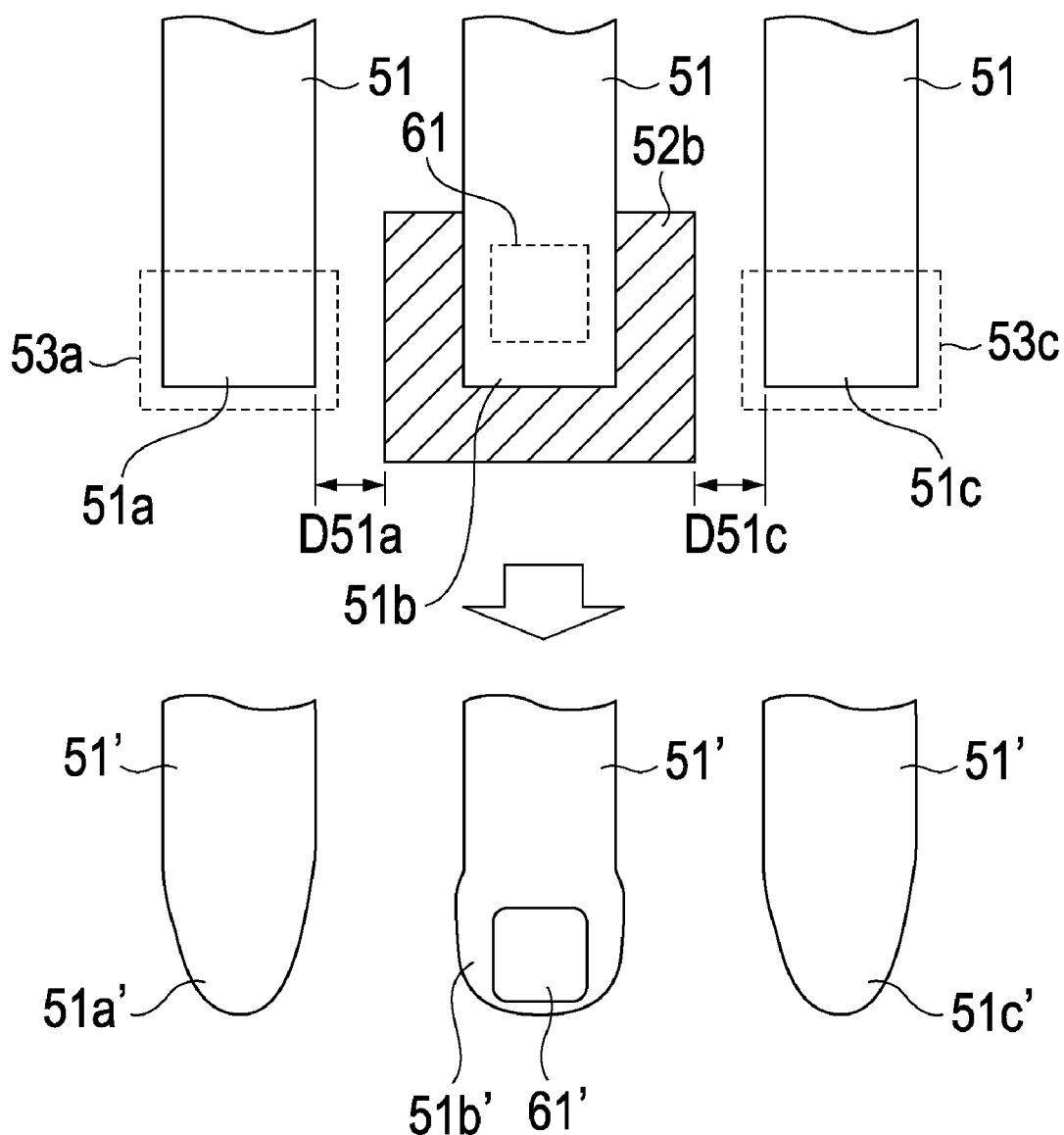
FIG. 10 is a magnified view of a region X illustrated in FIG. 9.

OPC is performed by the method described above. An example of a pattern on a photomask in which OPC is performed in accordance with the present embodiment is illustrated in FIGS. 9 and 10. FIG. 9 illustrates an example of a pattern formed on a photomask. FIG. 10 is a magnified view of the region X illustrated in FIG. 9. In FIG. 10, illustrations pointed by the open arrow indicate actual patterns formed on a wafer using the photomask on which that pattern is formed. The patterns illustrated in FIGS. 9 and 10 are ones after OPC.

As illustrated in FIGS. 9 and 10, an example pattern formed on a photomask is a mask wiring pattern 51. A mask via pattern 61 is formed on a photomask different from the photomask on which the mask wiring pattern 51 is formed. Regions 53a and 53b, which are indicated by the dotted lines illustrated in FIGS. 9 and 10, are OPC prohibited areas. In FIGS. 9 and 10, hatched regions 52b are areas where shapes of patterns are enlarged (correction areas). That is, the area 52b illustrated in FIG. 10 is an example in which a single OPC process among different types of OPC for all regions other than an OPC prohibited area is performed.

As illustrated in FIG. 10, with the present embodiment, an end 51b of a mask wiring pattern on a photomask may be subjected to sufficient OPC substantially without being affected by OPC performed on ends 51a and 51c. In such a way, in the present embodiment, among ends of a mask wiring pattern on a photomask, an end of the mask wiring pattern that is one in which a via is not present, that is, an end of the mask wiring pattern that is for use in exposing an end of wiring through which no current passes is set at an OPC prohibited area, so no OPC is to be performed on that area. Accordingly, an end of the mask wiring pattern that is for use in exposing an end of wiring through which a current may pass may be reliably subjected to OPC, so it may be subjected to sufficient OPC. As a result, for an actual pattern formed on the wafer, as indicated at an end 51b', a withdrawal of the pattern does not affect a couple 61' to a via, so a route through which a current passes may be sufficiently ensured between the wiring and the via.

Figure 11:
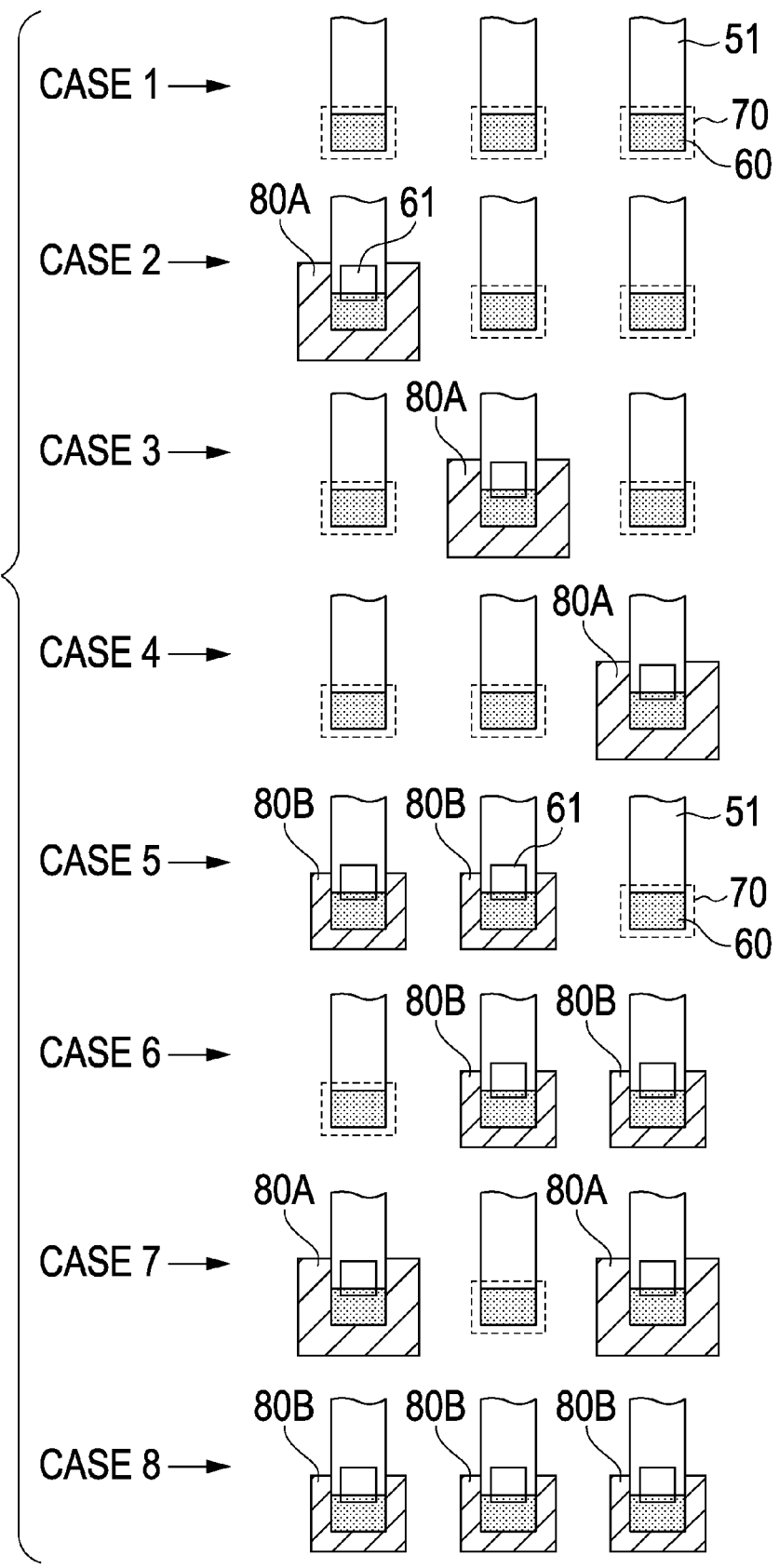
FIG. 11 illustrates all possible patterns in which a via may exist.

FIG. 11 illustrates all possible patterns where a via may be present in the region X in FIG. 9. In FIG. 11, each of the mask via patterns 61 is a pattern for use in exposing the substrate with a via. As illustrated in FIG. 11, the state in which a via is present may be classified into eight different cases of Case 1 to Case 8. Here, hatched regions 80A and 80B are correction areas for OPC. Regions 70 indicated by the dotted lines are areas subjected to enlargement, that is, OPC prohibited areas.

As described above, in Cases 2 to 4 and 7, as indicated at the correction areas 80A, ends of a mask wiring pattern may be subjected to sufficient OPC. Specifically, end marks 60 may be sufficiently enlarged by, for example, OPC. In contrast, in Cases 5, 6, and 8, as indicated at the correction areas 80B, sufficient OPC may not be performed. That is, the end marks 60 may not be sufficiently enlarged. Accordingly, if sufficient OPC may not be performed, as in these cases, it is preferable that the OPC value Cd be set at a value smaller than that used when sufficient OPC is performed, as indicated at the correction areas 80B. As illustrated in this FIG. 11, the use of correction areas having substantially the same size in end marks enables a withdrawal of a pattern occurring when a substrate is exposed to be minimized.

With a method of forming a photomask according to an embodiment of the present technique, sufficient OPC may be performed on an end that is highly required to be subjected to OPC among the ends of a mask wiring pattern on a photomask. Accordingly, it is useful in a semiconductor device substrate incorporated in a highly reliable information communication apparatus.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments have been described in detail, it should be understood that the various changes, substitutions, and alterations could be made hereto without departing from the spirit and scope of the invention.

The invention claimed is:

1. A method of performing an optical proximity effect correction on a photomask including a mask wiring pattern, comprising:
executing by a computer operations of:
extracting data of a not-coupled end included in data of an end from layout data of the mask wiring pattern, the not-coupled end not being coupled to a via;
applying an optical proximity effect correction on the data of the end other than the data of the not-coupled end;
generating a rectangular pattern on the end of the mask wiring pattern;
enlarging the rectangular pattern in the not-coupled end;
setting an area of the enlarged rectangular pattern to an area where the optical proximity effect correction is prohibited; and
applying an optical proximity effect correction on the data other than the area.

2. The method according to claim 1, further comprising, forming the rectangular pattern within the mask wiring pattern such that three sides of ends of the rectangular pattern overlap three sides of ends of the mask wiring pattern.

3. The method according to claim 1, further comprising:
extracting the mask wiring pattern having a predetermined width; and
generating the rectangular pattern only the end of the mask wiring pattern.

4. The method according to claim 1, further comprising:
extracting a coupled end from the layout data of the mask wiring pattern including the end of the mask wiring pattern, the coupled end being coupled to a via; and
performing optical proximity effect correction on the extracted mask wiring pattern.

5. The method according to claim 4, further comprising generating rectangular pattern on the end of the mask wiring pattern.

6. The method according to claim 5, further comprising determining that the end of the mask wiring pattern is the coupled end, if a gap between a mask via pattern for exposing the via and the rectangular pattern is within a predetermined distance range, or if the mask via pattern is formed over the rectangular pattern.

7. A method of forming a photomask including photomask wiring patterns, comprising:
executing by a computer operations of:
extracting the photomask wiring patterns from layout data of photomask;
extracting data of an end from the photomask wiring patterns;
extracting data of a not-coupled end from the data of the end; and
applying an optical proximity effect correction on the data of the end other than the data of the not-coupled end;
generating rectangular pattern on the end of the photomask wiring pattern;
enlarging the rectangular pattern in the not-coupled end;
setting an area of the enlarged rectangular pattern to an area where the optical proximity effect correction is prohibited; and
applying an optical proximity effect correction on the data other than the area.

8. The method according to claim 7, further comprising:
performing a simulation of enlarging shape of two adjacent photomask patterns on first optical proximity effect correction after the extracting data of the end;
obtaining a distance between the ends after the simulation;
comparing the distance with a value of a predetermined wiring rule; and
performing the optical proximity effect correction on second optical effect proximity correction that the distance becomes no less than the value of wiring rule if the distance is smaller than the value of the wiring rule.

9. A method of manufacturing a semiconductor device including a wiring pattern, comprising:
performing an optical proximity effect correction on layout data of photomask using when exposing a pattern on a substrate;
forming a mask wiring pattern on a mask substrate based corrected layout data to form the photomask; and
exposing the mask wiring pattern on the substrate using the photomask,
wherein the performing the optical proximity effect correction includes executing by a computer operations of:
extracting data of a not-coupled end included in data of an end from the layout data, the not-coupled end not being coupled to a via;
applying an optical proximity effect correction on the data of the end other than the data of the not-coupled end;
generating a rectangular pattern on the end of the mask wiring pattern;
enlarging the rectangular pattern in the not-coupled end;
setting an area of the enlarged rectangular pattern to an area where the optical proximity effect correction is prohibited; and
applying an optical proximity effect correction on the data other than the area.

10. The method according to claim 9, further comprising
extracting a coupled end coupling the via from the layout data of the mask wiring pattern including the end of the mask wiring pattern; and
performing an optical proximity effect correction on the extracted mask wiring pattern.

* * * * *